United States Patent
Chen et al.

(10) Patent No.: US 10,161,974 B1
(45) Date of Patent: Dec. 25, 2018

(54) FREQUENCY TO CURRENT CIRCUIT

(71) Applicant: Cadence Design Systems, Inc., San Jose, CA (US)

(72) Inventors: Ling Chen, Shanghai (CN); Fuyue Wang, Shanghai (CN); Thomas Evan Wilson, Laurel, MD (US); Jianyun Zhang, Shanghai (CN); Eric Harris Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/943,487

(22) Filed: Apr. 2, 2018

(51) Int. Cl.
*G01R 23/09* (2006.01)
*G01R 19/00* (2006.01)
*H03M 3/02* (2006.01)
*H03K 7/06* (2006.01)

(52) U.S. Cl.
CPC ......... *G01R 23/09* (2013.01); *G01R 19/0007* (2013.01); *H03K 7/06* (2013.01); *H03M 3/02* (2013.01)

(58) Field of Classification Search
CPC ...... G01R 23/09; G01R 19/0007; H03K 7/06; H03M 3/02
USPC .................................................. 327/101–103
See application file for complete search history.

(56) References Cited

U.S. PATENT DOCUMENTS

| | | | | |
|---|---|---|---|---|
| 6,091,281 | A * | 7/2000 | Yoshida | G01R 31/2841 327/102 |
| 6,999,745 | B2 * | 2/2006 | Leenaerts | H04B 1/30 327/102 |
| 9,154,151 | B1 | 10/2015 | Leong | |
| 2011/0156760 | A1 * | 6/2011 | Bhuiyan | H03K 3/011 327/102 |
| 2014/0159776 | A1 * | 6/2014 | Elran | G01R 23/09 327/102 |

OTHER PUBLICATIONS

U.S. Appl. No. 15/943,499, Non Final Office Action dated Oct. 22, 2018, 8 pages.

* cited by examiner

*Primary Examiner* — Thomas Skibinski
(74) *Attorney, Agent, or Firm* — Schwegman Lundberg & Woessner, P.A.

(57) ABSTRACT

Aspects of the present disclosure include a frequency-to-current (F2I) circuit and systems, methods, devices, and other circuits related thereto. The F2I circuit is implemented with a delta-modulator-based control loop to settle and maintain an operating point on a bias node. The control loop provides an integral of an output of a comparator, and the comparator compares it to a self-built voltage reference. Upon powering on the circuit, an integrator in the control loop starts to integrate the charge on both a bias voltage and an internal voltage to provide a settling process for the internal voltage to approximate the reference voltage and for the bias voltage to approximate a predetermined operating point of the bias node. After the circuit has settled, the comparator's output charge toggles and the internal voltage and bias voltage become sawtooth-like waveforms at the reference voltage and operating points, respectively.

20 Claims, 4 Drawing Sheets

US 10,161,974 B1

FREQUENCY TO CURRENT CIRCUIT

TECHNICAL FIELD

The present disclosure generally relates to integrated circuit (IC) design. In particular, the present disclosure addresses a frequency-to-current (F2I) circuit design.

BACKGROUND

Bias circuits are widely employed in analog or mixed signal electronic circuitry to set operating conditions by establishing a predetermined voltage at a given node. Typically, this operating condition is either established by a diode connected transistor with a current reference, or established by a diode connected transistor with a voltage reference. The latter type of circuit may act as a representative bias that configures a P-type metal-oxide-semiconductor (PMOS) transistor that is in diode connection indirectly with an amplifier in a negative feedback loop. The negative feedback loop introduces a reference voltage and helps to provide a larger output impedance for the bias circuit to improve performance while consuming less headroom than other approaches to bias circuit design. However, there may be situations in which it would be necessary or desired to dispense of either current or voltage input reference signals due to difficulties and constraints in providing such a reference signal.

Additionally, in some fields, a frequency proportioned output may be required for a bias circuit. For example, Phase Lock Loop (PLL) circuitry often find application in skew cancellation for phase aligning an internal clock to an input/output (I/O) clock. These sorts of PLLs have a wide range of application and are often employed with a wide bandwidth tuning range. Thus, it may be useful to employ a current bias proportional to a reference clock frequency along with different reference clocks to tune the bandwidth of the deskew PLL. However, conventional bias circuits, such as those described above, cannot output a frequency proportioned current.

There are, however, certain design approaches for implementing a frequency to current (F2I) convertor based on the conventional voltage reference bias circuit described above. For example, a switched capacitor resistor with an equivalent resistance that is inversely proportional to the frequency may be utilized for such a F2I converter. In this example, the equivalent resistance is equal to 1/(Fin*C), where Fin is the clock frequency and C is the capacitance of the switched capacitor resistor. Thus, in this example, the equivalent current flowing through the F2I circuit, which is proportional to the clock frequency, is given by VREF*Fin*C, where VREF is the reference voltage.

However, this implementation of the F2I circuit still has many limitations. For example, the F2I circuit described above requires the voltage source VREF as a reference. Further, the F2I circuit described above is limited in that it consumes only static current in an analog amplifier. Additionally, such a F2I circuit may find limited use in an analog/mixed signal (AMS) application, because of its lack of portability and robustness, which are important considerations for digital circuits.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure include a frequency-to-current (F2I) circuit and systems, methods, devices, and other circuits related thereto. The F2I circuit is implemented with a delta-modulator-based control loop to settle and maintain an operating point on a bias node. The control loop provides an integral of a comparator's output, and compares it to a self-built voltage reference. Upon powering on the circuit, an integrator in the control loop starts to integrate the charge on both a bias voltage and an internally generated voltage to provide a settling process for the internal voltage to approximate the reference voltage and for the bias voltage to approximate a predetermined operating point of the bias node. After the circuit has settled, the comparator's output charge toggles and the internal voltage and bias voltage become sawtooth-like waveforms at the reference voltage and operating points, respectively.

Figure 1:
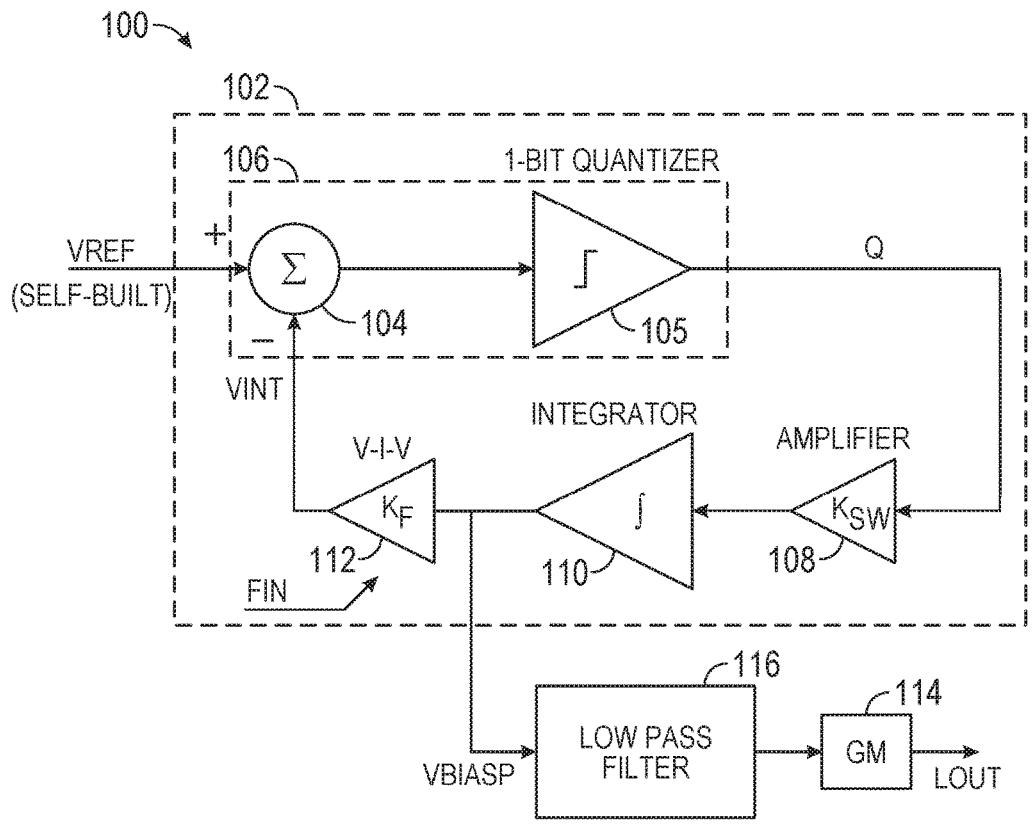
FIG. 1 is a block diagram illustrating a Delta-Modulator-based F2I circuit, according to some example embodiments.

With reference to FIG. 1, a delta-modulator-based F2I circuit 100 is shown. The delta-modulator-based F2I circuit 100 receives a clock signal, and converts the frequency of the clock signal (represented by "Fin" in FIG. 1) to an output target current Iout. As shown, the delta-modulator-based F2I circuit 100 includes a control loop 102. The control loop 102 includes a summer 104 and a 1-bit quantizer 105. At its inputs, the summer 104 receives a self-built reference voltage VREF and an internally generated voltage Vint. The summer 104 sums the two input voltages and provides the result at its output, which is connected to the input of the quantizer 105. The quantizer 105 quantizes the summed voltage inputs and provides the resulting output signal Q at its output. Together, the summer 104 and the quantizer 105 form a two input comparator 106 that receives the self-built reference voltage VREF and the internally generated voltage Vint, and compares the two input voltages to provide the output signal Q based on a result of the comparison.

In some embodiments, an inverter may be used to implement the comparator 106. In these embodiments, the inverter has a self-built turnover voltage that may be used as the self-built reference voltage VREF. In some embodiments, the circuit 100 may be designed in a manner to provide a higher noise tolerant bias by implementing the summer 104 with multiple self-built references and the quantizer 105 with multiple thermometer outputs. In these embodiments, the multiple thermometer outputs of the quantizer 105 may be encoded using binary encoding or any other encoding to reduce line routing.

As shown in FIG. 1, the control loop 102 further includes an amplifier 108. The output Q of the quantizer 105 is connected to the input of the amplifier 108. The amplifier 108 amplifies the output Q received from the quantizer 105. The amount the amplifier 108 amplifies the output Q is based on the gain of the amplifier 108 (denoted in FIG. 1 as "$K_{sw}$"), which controls the control loop 102 gain. In some embodiments, a switched-capacitor configuration is employed to provide this gain controlling stage.

In the control loop 102, the output of the amplifier 108 is connected to an integrator 110, and thus, the amplifier 108 provides the amplified output Q to the integrator 110. The integrator 110 generates bias voltage Vbiasp by performing a time integration on the amplified output Q. Together, the amplifier 108 and the integrator 110 form an amplification stage that tunes and integrates the output Q to produce the bias voltage Vbiasp at its output.

As will be discussed in further detail below, the integrator 110 may be implemented with a switched capacitor, in some embodiments. Further, although FIG. 1 illustrates the amplifier 108 and the integrator 110 as being separate and distinct, in other embodiments, the amplifier 108 and the integrator 110 may be merged together into a single component that tunes and integrates the bias voltage Vbiasp.

The output of the integrator 110 is connected to a voltage-to-current-to-voltage (V-I-V) converter 112. The V-I-V converter 112 generates an internal voltage Vint by first converting the bias voltage Vbiasp to current, then converting the current to the internal voltage Vint. In the V-I-V converter 112, a transconductance stage is used to perform the voltage-to-current (V-I) conversion. The transconductance stage of the V-I-V converter 112 may be implemented with a biased transistor. The current-to-voltage (I-V) stage of the V-I-V converter 112 may be implemented with a switched-capacitor network to act as an equivalent frequency related resistor. In the context of the switched-capacitor implementation, the V-I-V converter 112 is controlled by the input clock signal, the frequency of which is represented by "Fin" in FIG. 1. Further details regarding the controlling of V-I-V converter 112 by the input clock signal are discussed below in reference to FIGS. 2-4.

The output of the integrator 110 is also connected to the input of a low pass filter (LPF) 116, which receives the bias voltage Vbiasp as input. The LPF 116 may be implemented passively or actively. For example, in passive implementations, the LPF 116 may be implemented with a capacitor, a capacitor and resistor, or a switched-capacitor network. The LPF 116 filters noise from the bias voltage Vbiasp, and provides the filtered bias voltage to a transconductance stage 114, which is denoted by "gm" in FIG. 1. As will be discussed below, the LPF 116 may also be implemented with a switched capacitor, and the transconductance stage 114 may be implemented with at least one transistor. A current Iout is output at the transconductance stage 114.

As shown in FIG. 1, the control loop 102 feeds back the integral of the output Q of the quantizer 105 (Vint), and compares to the self-built reference VREF. The integrator 110 in this loop starts to integrate the charge on both the bias voltage Vbiasp and the internally generated voltage Vint once the circuit 100 is powered on. This is a settling process for Vint to approximate the reference voltage VREF and for bias voltage Vbiasp to approximate a predetermined operating point of a bias node. After the circuit 100 has settled, the output Q of the quantizer 105 toggles and the internal voltage Vint and the bias voltage Vbiasp become saw-tooth-like waves.

Figure 2:
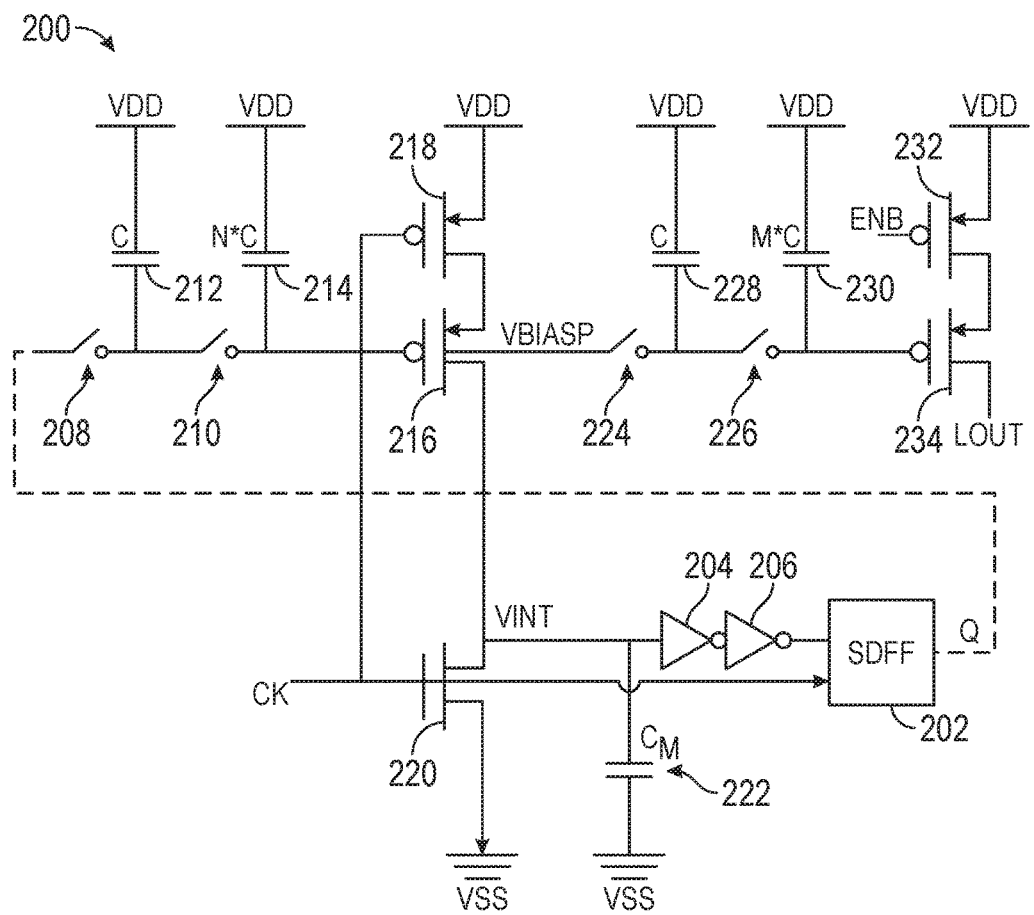
FIG. 2 is a circuit diagram illustrating an example reference-less digitized Delta-Modulator-based F2I circuit, according to some example embodiments.

FIG. 2 is a circuit diagram illustrating an example reference-less digitized Delta-Modulator-based F2I circuit 200, according to some example embodiments. In the context of FIG. 2, "C" is used to denote a capacitance value for corresponding capacitors, and where noted, "M" and "N" are used as multipliers to the capacitance value "C".

As shown, to form the clock driving quantizer 105 and the summer 104, a set-able D flip-flop (SDFF) 202 is connected to an output of two series connected inverters 204 and 206. Switches 208 and 210 along with capacitors 212 and 214 form the amplification stage comprising the amplifier 108 and the integrator 110. As shown, the switches 208 and 210 are connected in series with the switch 208 being connected between the output of the SDFF 202 and the input of switch 210. The switch 210 is connected between the output of the switch 208 and the lower terminal of the capacitor 214. The switches 208 and 210 may, for example, each be implemented with a complementary metal-oxide-semiconductor (CMOS) transmission gate.

Capacitor 212 is connected between a positive supply voltage Vdd and the output of switch 208. Capacitor 214 is connected between the supply voltage Vdd and the output of switch 210. The capacitance of the capacitor 214 is directly proportional to the capacitance of capacitor 212. For example, as shown, capacitor 212 has a capacitance of C and the capacitor 214 has a capacitance of N*C. The ratio of the capacitance of the capacitors 212 and 214 (i.e., "N") determines the gain of the amplifier 108.

A biased P-type metal-oxide-semiconductor (PMOS) transistor 216 forms the V-I stage of the V-I-V converter 112 while a PMOS transistor 218 and an N-channel metal-oxide-semiconductor (NMOS) transistor 220 along with capacitor 222 form the I-V stage of the V-I-V converter 112. As shown, the V-I-V converter 112 receives an input clock signal CK, which corresponds to the input frequency Fin illustrated in FIG. 1. More specifically, the gate terminals of both the PMOS transistor 218 and the NMOS transistor 220 are connected to a clock signal CK. The clock signal CK may, in some embodiments, have a 50% duty cycle.

The source terminal of the PMOS transistor 218 is connected to the supply voltage Vdd while the drain terminal of the PMOS transistor 218 is connected to the source terminal of the biased PMOS transistor 216. The drain terminal of the NMOS transistor 220 is connected to the drain terminal of the biased PMOS transistor 216, and the source terminal of the NMOS transistor 220 is connected to a negative source voltage Vss (e.g., ground).

Switches 224 and 226 along with capacitors 228 and 230 form the LPF 116. More specifically, the switches 224 and 226 are connected in series with the output of switch 224 being connected to the input of switch 226. Capacitor 228 is connected between the supply voltage Vdd and the output of switch 224. Capacitor 230 is connected between the supply voltage Vdd and the output of switch 226. The switch 224 and the capacitor 228 sample the noise of the Vbiasp, and the switch 226 and capacitors 228 and 230 filter this noise by 1/M shrinking. The LPF 116 has a firm bandwidth of approximately about Fin/M.

Transistor 232 is an enable device for the circuit 200 that receives an enable signal Enb, which determines whether the current Iout is output. Transistor 234 forms the transconductance stage 114 from which the current Iout is output.

In operation of the circuit 200, the SDFF 202 samples the output of inverter 206 and holds the output Q for entire clock period. In power down mode, the output signal from the SDFF 202 is high (e.g., a binary "1") and each of the switches 208, 210, 224, and 226 are closed so that the biased transistor 216 may maintain a low leakage state. Switches 208 and 224 are controlled by a control signal $CK_{S1/S3}$ and switches 210 and 226 are controlled by control signal $CK_{S2/S4}$. Control signals $CK_{S1/S3}$ and $CK_{S2/S4}$ are non-overlapping in that both signals are never high (e.g., a binary "1") at the same time. Both control signals $CK_{S1/S3}$ and $CK_{S2/S4}$ are generated from the clock signal CK in a manner that picks up the rising and falling edges of CK, respectively. More specifically, as will be discussed further below in reference to FIG. 3, the control signal $CK_{S1/S3}$ pulses on the rising edges of CK, while control signal $CK_{S2/S4}$ pulses on the falling edges of CK.

The PMOS transistor 218 and the NMOS transistor 220 act as two switches and form a switched-capacitor resistor when combined with the capacitor 222. The equivalent resistance of this switched-cap resistor may be expressed as follows:

$$R_{EQU}=1/(f_{CK}*C_M)$$

where $f_{CK}$ is the frequency of clock signal CK, and $C_M$ is the capacitance of capacitor 222. Thus, the peak internal voltage Vint may be expressed as follows:

$$Vint_{PEAK}=Vbiasp*gm_p/(f_{CK}*C_M)$$

where $gm_p$ is the transconductance of the PMOS transistor 216. The current that flows through the PMOS transistor 218 would then be equal to:

$$I=Vbiasp*gm_p=Vint_{PEAK}*f_{CK}*C_M$$

The average of the peak of the internal voltage $Vint_{PEAK}$ is equal to the turnover voltage of the inverter 204 if this circuit 200 has been settled.

Figure 3:
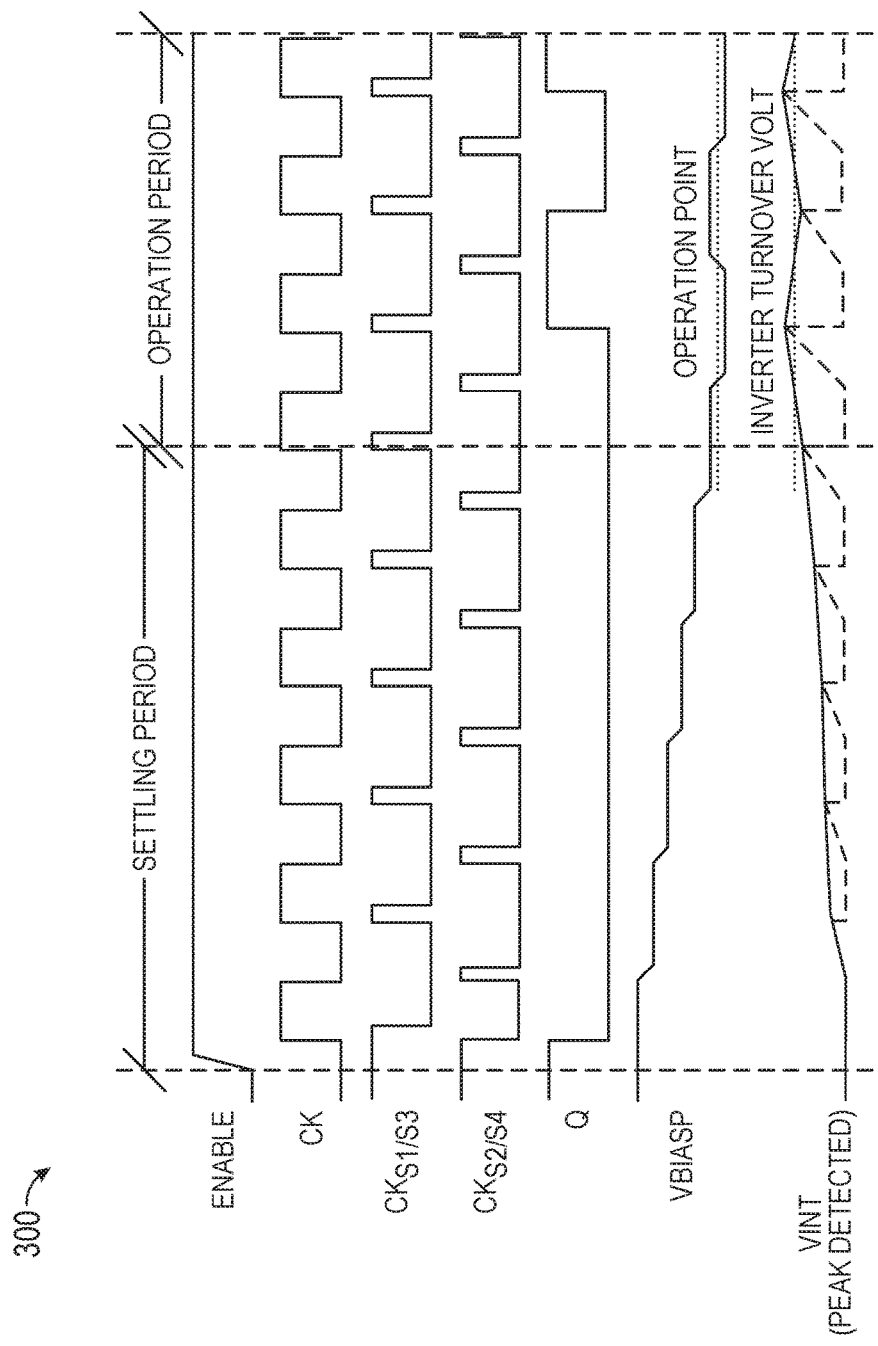
FIG. 3 is a timing diagram illustrating a wave profile of an internal node of the reference-less digitized Delta-Modulator-based F2I circuit, according to some example embodiments.

FIG. 3 is a timing diagram illustrating a wave profile 300 of an internal node of the reference-less digitized Delta-Modulator-based F2I circuit 200, according to some example embodiments. As shown, the non-overlapping control signals $CK_{S1/S3}$ and $CK_{S2/S4}$ are generated based on the clock signal CK, which has a 50% duty cycle. More specifically, the control signal $CK_{S1/S3}$ picks up the rising edges of CK, while clock signal $CK_{S2/S4}$ picks up falling edges of CK.

After the enable signal is received, the wave profile 300 shows how the circuit 200 has two periods of operations—a settling period and a normal operation period. During the settling period, the bias voltage Vbiasp is pulled down to a final operating point where it continues to operate during the normal operation period. The peak of the internal voltage Vint is gradually pulled up to the turnover voltage of the inverter 204 during the settling period where it is maintained throughout the normal operation period. The inverter 204 acts as a comparator and toggles the output Q of the quantizer 105 once this settling period ends.

Those of ordinary skill in the art will appreciate that quantization noise and slope overload are two key issues for delta modulators. Slope overload occurs when the sawtooth approximation provided by the delta modulator cannot keep up with the rate-of-change of the input signal in the region of the greatest slope. Here, the input signal is the turnover voltage of the inverter 206, which is relatively constant. Thus, with the bias scheme used in the circuit 200, slope overload should not be an issue. This also helps to address the quantization noise issue by setting a smaller gain (step) for the control loop 102.

In the context of the circuit 100 and the example embodiment of the circuit 100 illustrated in FIG. 2 (i.e., circuit 200), there are two different step sizes (gains) in the control loop 102 that tune the internal voltage Vint and the bias voltage Vbiasp to match to their final values. For example, if the bias voltage Vbiasp settles to an average voltage Vb, the step size for tuning the bias node may be either (Vdd−Vb)/(N+1) or Vb/(N+1) depending on whether the output Q of the quantizer 105 is equal to the negative supply voltage Vss or the positive supply voltage Vdd. Often, the average bias voltage Vb for a PMOS transistor is lower than half the drain voltage (Vdd/2) especially for a low supply process. Thus, if the step size is Vb/(N+1) it will be smaller than if the step size is (Vdd−Vb)/(N+1). With a smaller step size (gain), the control loop 102 tunes the voltages slower, but a larger step size (gain) causes the control loop 102 to tune the voltages faster. Thus, the output Q of the quantizer 105 may be an unbalanced direct current (DC) signal (e.g., a non-50% duty-cycle signal).

Additionally, in converting the bias voltage Vbias to the internal voltage Vint, the V-I-V converter 112 introduces second or higher order effects to the internal voltage Vint. This may also add some variation to the loop gain (step) when tuning in different directions. Further, noise on the turnover voltage of the inverter 206 may disturb the functioning of the quantizer 105 and may also lead to an undetermined result.

Each of the forgoing issues may contribute to uncertain quantization noise. Each time the quantizer 105 makes a decision, error accumulation occurs. This slow error accumulation and modulation of the control loop 102 may cause the quantizer 105 to operate such that the output Q does not coincide with what is illustrated in FIG. 3 (e.g., with a 50% duty cycle after the circuit is settled). Instead, the quantizer 105 may operate with a random duty cycle. The slow error accumulation and modulation may also be reflected on the bias voltage Vbiasp as well as the output current Iout when the LPF 116 is unable to filter the in-band noise effectively. This may result in a slow ripple in the output current Iout, which may not be acceptable in some applications.

Figure 4:
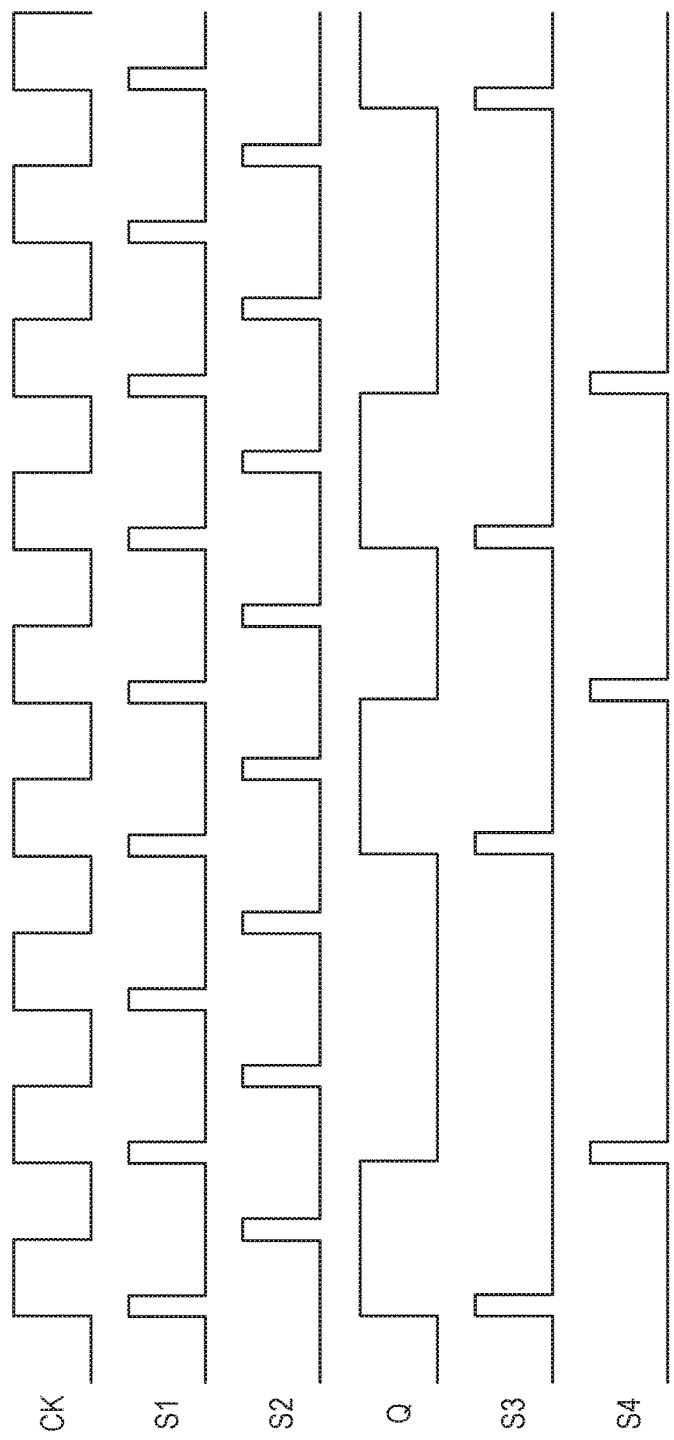
FIG. 4 is a timing diagram illustrating a scheme for filtering low frequency ripple in the reference-less digitized Delta-Modulator-based F2I circuit, according to some example embodiments.

To address the forgoing issues, FIG. 4 presents an alternative scheme for filtering low frequency ripple in the reference-less digitized Delta-Modulator-based F2I circuit 200, according to some example embodiments. The scheme illustrated in FIG. 4 adopts the same architecture for the LPF 116 used in the circuit 200 illustrated FIG. 2, except the output Q of the quantizer 105 is used for generating the control signal for switches 224 and 226 instead of the clock signal CK. More specifically, the scheme illustrated in FIG. 4, control signal S3 for the switch 224 pulses on the rising edges of the output Q, and control signal S4 for the switch 226 pulses on the falling edges of the output Q. Control signal S1, which controls the switch 208, pulses on the rising edges of CK, while clock signal S2 controls the switch 210 and pulses on the falling edges of CK. With this configuration for the LPF 116, a smaller ripple can be obtained on the output current Iout, although this may result in a bit offset error.

Although the embodiments of the present disclosure have been described with reference to specific example embodiments, it will be evident that various modifications and changes may be made to these embodiments without departing from the broader scope of the inventive subject matter. For example, With the embodiments described above, PMOS loads are used as current mirrors, although in alternate embodiments, NMOS or other transistor types may be used. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A frequency to current circuit comprising:
   a comparator having two comparator inputs, a first comparator input connected to a reference voltage, a second comparator input connected to an internal voltage generated by the frequency to current circuit, the comparator configured to compare the reference voltage with the internal voltage and to provide a comparator output signal based on the comparison;
   an amplifier, connected to the comparator, to amplify the comparator output signal to provide an amplified comparator output signal;
   an integrator, connected to the amplifier, to perform a time integration on the amplified comparator output signal to generate a bias voltage;
   a voltage-to-current-to-voltage converter connected to the integrator and the second comparator input, the voltage-to-current-to-voltage converter configured to convert the bias voltage to the internal voltage;
   a low pass filter connected to the integrator, the low pass filter configured to filter the bias voltage to provide a filtered bias voltage; and
   a transconductance stage connected an output of the low pass filter, the transconductance stage configured to transfer the filtered bias voltage to an output current.

2. The frequency to current circuit of claim 1, wherein the comparator comprises:
   a summer configured to sum the reference voltage and the internal voltage to provide a summer output signal; and
   a quantizer connected to the summer, the quantizer to quantize the summer output signal to provide the comparator output signal.

3. The frequency to current circuit of claim 2, wherein:
   the summer includes multiple self-built references; and
   the quantizer includes multiple thermometer outputs.

4. The frequency to current circuit of claim 3, wherein the multiple thermometer outputs of the quantizer are encoded using binary encoding.

5. The frequency to current circuit of claim 1, wherein the comparator comprises an inverter having a self-built turnover voltage, the self-built turnover voltage corresponding to the reference voltage.

6. The frequency to current circuit of claim 5, wherein the comparator further comprises a set-able flip-flop connected to an output of the inverter.

7. The frequency to current circuit of claim 1, wherein the amplifier and the integrator are combined into an amplification stage.

8. The frequency to current circuit of claim 1, wherein the amplification stage comprises:
   a first capacitor connected between a positive supply voltage and a first switch, the first switch being connected between the first capacitor and the comparator, the first capacitor having a first capacitance; and
   a second capacitor connected between the positive supply voltage and a second switch, the second switch connected between the first capacitor and the second capacitor, the second capacitor having a second capacitance, the second capacitance being directly proportional to the first capacitance, a ratio of the first and second capacitors determining a gain of the amplifier.

9. The frequency to current circuit of claim 8, wherein:
   the first switch is controlled by a first control signal generated based on the input clock signal,
   the second switch is controlled by a second control signal generated based on the input clock signal, and
   the first and second control signals are non-overlapping.

10. The frequency to current circuit of claim 9, wherein:
    the first control signal pulses on rising edges of the input clock signal, and
    the second control signal pulses on falling edges of the input clock signal.

11. The frequency to current circuit of claim 10, wherein the input clock signal has a 50% duty cycle.

12. The frequency to current circuit of claim 1, wherein the voltage-to-current-to-voltage converter comprises:
    a voltage-to-current stage comprising a bias transistor configured to convert the bias voltage to a current; and
    a current-to-voltage stage comprising a switched-capacitor resistor, the I-V stage configured to convert the current to the internal voltage by injecting the current into the switched-capacitor resistor.

13. The frequency to current circuit of claim 1, wherein the low pass filter comprises:
    a first capacitor connected between a positive supply voltage and a first switch, the first switch being connected between the first capacitor and the bias voltage, the first capacitor having a first capacitance; and a second capacitor connected between the positive supply voltage and a second switch, the second switch connected between the first capacitor and the second capacitor, the second capacitor having a second capacitance, the second capacitance being directly proportional to the first capacitance.

14. The frequency to current circuit of claim 13, wherein the transconductance stage comprises a transistor connected to the second capacitor.

15. The frequency to current circuit of claim 13, wherein:
the first switch is controlled by a first control signal,
the second switch is controlled by a second control signal, and
the first and second control signals are non-overlapping.

16. The frequency to current circuit of claim 15, wherein:
the first and second control signals are generated based on an input clock signal with a 50% duty cycle,
the first control signal pulses on rising edges of the input clock signal, and
the second control signal pulses on falling edges of the input clock signal.

17. The frequency to current circuit of claim 15, wherein:
the first and second control signals are generated based on the comparator output signal,
the first control signal pulses on rising edges of the comparator output signal, and
the second control signal pulses on falling edges of the comparator output signal.

18. A method comprising:
comparing, at a comparator, a reference voltage with an internal voltage to provide a comparator output signal based on the comparison;
amplifying the comparator output signal to provide an amplified comparator output signal;
performing a time integration on the amplified comparator output signal to provide a bias voltage;
converting the bias voltage using a voltage-to-current-to-voltage converter to generate the internal voltage;
filtering the bias voltage using a low pass filter to provide a filtered bias voltage; and
transferring, at a transconductance stage, the filtered bias voltage to an output current.

19. The method of claim 18, wherein the comparing of the reference voltage with the internal voltage comprises:
summing the reference voltage and the internal voltage using a summer, the summing of the reference voltage and the internal voltage yielding a summer output signal; and
quantizing the summer output signal using a quantizer, the quantizing of the summer output signal yielding the comparator output signal.

20. A circuit comprising:
a summer having two summer inputs, a first summer input connected to a reference voltage, a second summer input connected to an internal voltage generated by the circuit, the summer configured to sum the reference voltage and the internal voltage to provide a summer output signal; and
a quantizer, connected to the summer, to quantize the summer output signal to provide a quantizer output signal;
an amplifier, connected to the quantizer, to amplify the quantizer output signal to provide an amplified quantizer output signal;
an integrator, connected to the amplifier, to perform a time integration on the amplified quantizer output signal to generate a bias voltage;
a bias transistor, connected to the integrator, to convert the bias voltage to a current;
a switched-capacitor resistor, connected to the bias transistor and the second comparator input, to convert the current to the internal voltage; and
a transconductance stage, connected to the switched-capacitor resistor, to transfer the bias voltage to an output current.

* * * * *